Feb. 5, 1963 A. YARIV 3,076,941

MICROWAVE SEMICONDUCTIVE PARAMETRIC AMPLIFIER AND MULTIPLIER

Filed April 25, 1960

INVENTOR
A. YARIV
BY David P. Kelley
ATTORNEY 3,076,941

MICROWAVE SEMICONDUCTIVE PARAMETRIC AMPLIFIER AND MULTIPLIER

Amnon Yariv, Chatham, N.J., assignor to Bell Telephone Laboratories, Incorporated, New York, N.Y., a corporation of New York Filed Apr. 25, 1960, Ser. No. 24,402
5 Claims. (Cl. 330—4.9)

Figure 1:
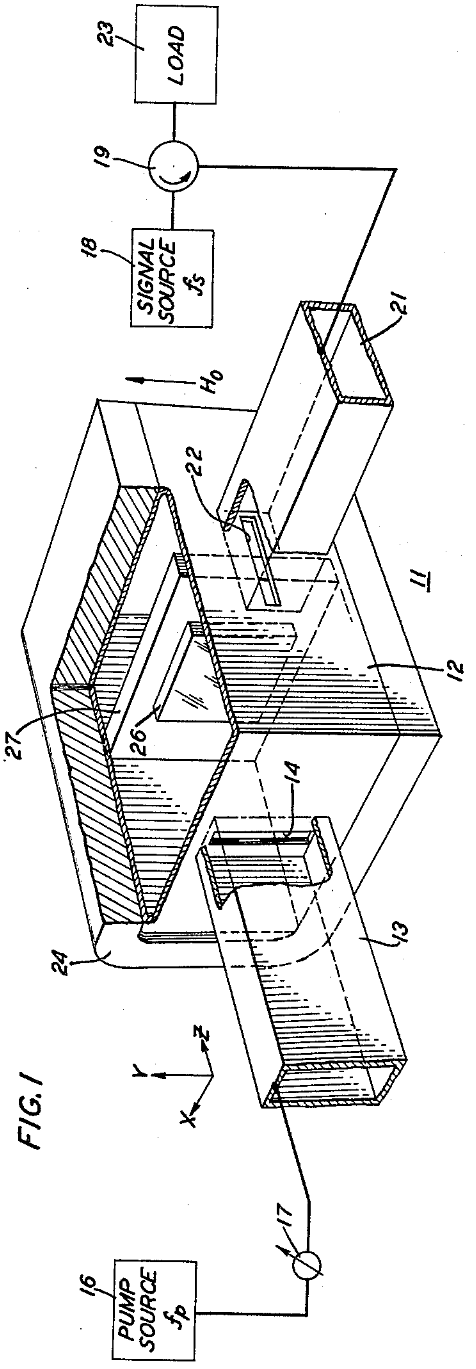

This invention relates to amplification and frequency multiplication of microwaves, and, more particularly, to low noise, solid state devices for producing such amplification or multiplication.

In order to achieve lower noise amplification than has heretofore been possible with conventional amplifying devices, workers in the art have turned to the principle of parametric amplification. Basically, the term parametric amplification implies the variation of a parameter, generally a reactance, of the amplifier at a frequency other than that of the signal to be amplified to produce an amplified signal. A variety of devices utilizing this principle have been realized, including electron beam devices, semiconductor diode devices, and gyromagnetic or ferrite devices.

For the realization of low noise performance with electron beam devices, which are inherently quite noisy, it has been necessary to include special noise reducing circuitry in the device in addition to the conventional circuitry, thereby greatly adding to the complexity of such devices.

Where the element relied upon for amplification is inherently a low noise device, such as a ferrite or a semiconductor diode, complex noise reducing circuitry is not necessary. On the other hand, these devices present unique problems of their own. For example, semiconductor diodes require particular biasing potentials in many cases, thereby necessitating power supplies and complex mounting and insulating arrangements when used in a waveguide or resonant cavity. In addition, because they are diodes, they are in most cases more expensive and complex than would be a uniform piece of material. Ferrite devices do have the advantage of being a single piece of uniform material. However, inasmuch as these devices rely on gyromagnetic resonance to produce amplification, they must be biased by a magnetic field. As the frequency of operation is increased, the magnetic field must likewise be increased so that the device's resonant frequency, which is determined by the strength of the magnetic field, will be increased. At microwave frequencies, this necessitates a very strong magnetic field.

It is an object of the invention to produce low noise operation in a device that requires no complex noise removing circuitry, no complex mounting arrangements or external power supplies, and which eliminates the necessity of extremely high magnetic biasing fields at microwave frequencies in a parametric amplifier.

These and other objects of the present invention are achieved in a first illustrative embodiment thereof which comprises a cavity resonator designed to be resonant at a signal frequency and at a frequency that is twice the signal frequency. A permanent magnet on the exterior of the resonator establishes a magnetic field along one coordinate axis of the resonator. A first waveguide is coupled to the resonator through an iris for supplying pump energy at twice the signal frequency to the resonator, and a second waveguide is likewise coupled to the resonator through an iris for supplying signal energy to the resonator.

It is a feature of the present invention that a slab of doped semiconductor material of a single conductivity type is mounted within the resonator in a plane that is parallel to the magnetic field and at right angles to the direction of propagation of the pump wave as it is applied to the resonator.

It is another feature of the present invention that the electric field of the pump wave is oriented at right angles to the magnetic field of the magnet and to the direction of propagation of the pump wave.

In a second illustrative embodiment of the invention, no pump energy is applied to the resonator, only energy at the signal frequency. Under these conditions, energy at the pump frequency, that is, twice the signal frequency, is extracted from the device, thereby giving frequency multiplication.

Accordingly, it is a further feature of the present invention that frequency multiplication is achieved by introducing only energy at the signal frequency into the resonator.

Figure 2:
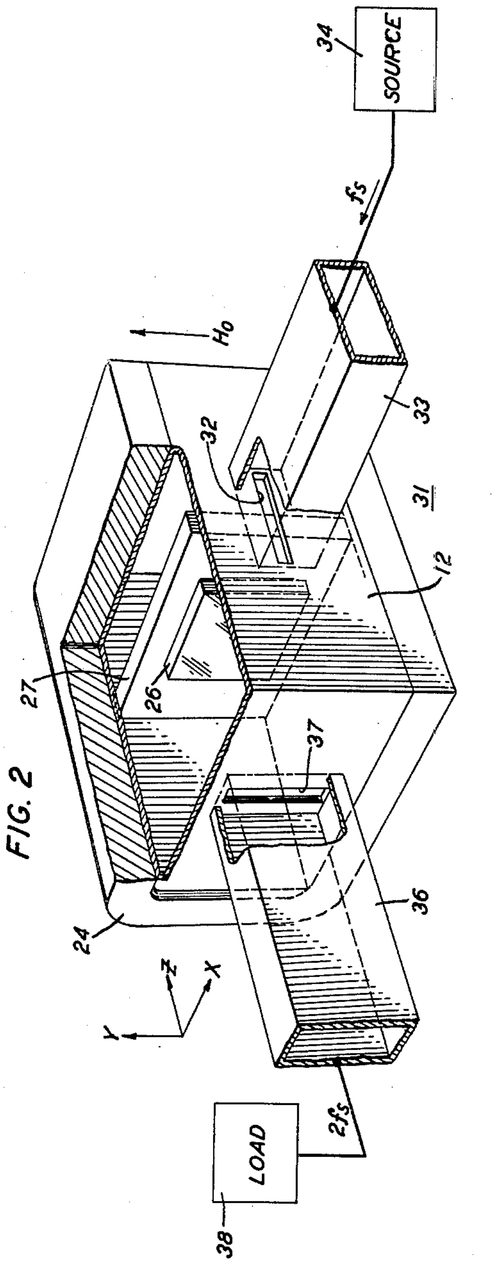

These and other features of the present invention will be more readily apparent from the following description, taken in conjunction with the accompanying drawings, in which:

FIG. 1 is a perspective view of a first illustrative embody of the invention; and FIG. 2 is a perspective view of a second illustrative embodiment of the invention.

Turning now to FIG. 1, there is shown a parametric amplifier 11 embodying the principles of the present invention. Amplifier 11 comprises a cavity resonator 12 which is designed to resonate at a frequency $f_s$ and at a frequency $2f_s$, hereinafter designated $f_p$. For convenience, the resonator 12 has been shown as having three coordinate axes, oriented as shown. A rectangular waveguide 13 is connected to resonator 12 and is electromagnetically coupled to the interior thereof through an iris 14, shown here as a slit, but which may take any one of a number of suitable configurations well known in the art. Waveguide 13 is connected to resonator 12 in such a manner that electromagnetic waves in the guide propagate in the direction of the Z-axis of the resonator while the electric field of the wave is parallel to the X-axis of the resonator. A source 16 of energy at the frequency $f_p$ supplies pump energy to guide 13 and resonator 12 through a phase shifter 17.

Signals to be amplified are applied to resonator 12 from a signal source through a circulator 19 and wave guide 21 which is coupled to resonator 12 through an iris 22 of suitable configuration. Amplified signals are extracted from resonator 12 through iris 22 and pass via guide 21 to circulator 19, which directs them to a load or utilization device 23. For simplicity, sources 16 and 18, phase shifter 17, circulator 19 and load 23 have all been depicted schematically or in block diagram. It is to be understood that these devices may take any of a number of forms well known in the art.

A magnetic field $H_0$, parallel to the Y-axis of resonator 12 is established within a resonator 12 by a permanent magnet member 24. The means for establishing such a field $H_0$ may take any of a number of forms, such as an electromagnet or other configuration of permanent magnet, the form shown in FIG. 1 being by way of example only.

Within resonator 12, and located approximately centrally thereof, is a slab or thin plate 26 of semiconductor material of single conductivity type such as, for example, indium-antimony or phosphor doped germanium, characterized in that it has a number of available charge carriers sufficient to accomplish the desired operation as discussed hereinafter. Slab 26 is mounted with its broad face perpendicular to the Z-axis. It is supported by a slab 27 of polyfoam or other suitable material of low dielectric constant. Alternatively, to facilitate locating slab 26 centrally of resonator 12, the member 27 may be made half the length of resonator 12, or slab 26 may be mounted between two such members. It is to be understood that while member 26 is shown as a slab, it may have any one of a number of suitable shapes.

In operation, pump energy at a frequency $f_p$ is applied to resonator 12 through waveguide 13 and iris 14, with the electric field of the pump wave energy being oriented parallel to the X-axis. Signal energy to be amplified is likewise applied to resonator 12 through guide 21 and iris 22. A steady state magnetic field $H_0$ exists within resonator 12 and is oriented parallel to the Y-axis. By a mechanism to be explained more fully hereinafter, the signal at frequency $f_s$ is amplified and extracted from resonator 12 through iris 22 and guide 21 and is applied to load 23 by means of circulator 19.

In the Proceedings of the I.R.E., vol 46, No. 2, February 1958, at pages 494–495, T. J. Bridges, in a letter to the editors shows that signal gain in a resonant cavity can be achieved if the capacitance of the cavity can be varied at a rate differing from the signal frequency, for instance, at twice the signal frequency.

The expression for the energy stored in a resonant cavity is given by $$\Delta\epsilon=\frac{1}{2}CV^2 \qquad (1)$$

where $\epsilon$ is energy, C is the capacitance of the cavity and V is voltage. If a plasma, by which is meant a medium containing free electrons, is introduced into the cavity there will be a change in the energy in the cavity as a result of the kinetic energy of the free electrons, or holes, thus Equation 1 becomes $$\epsilon+\Delta\epsilon=\frac{1}{2}(C+\Delta C)V^2 \qquad (2)$$

assuming V is constant. Thus, it can be seen that a plasma containing free electrons, or holes, brings about a change in capacitance of the cavity. In a plasma containing cavity, it can be shown that $$\Delta\epsilon\propto\Delta C\propto n\propto\rho \qquad (3)$$

where $n$ is the number of free electrons in the cavity and $\rho$ is the electron density in the plasma.

Thus far we have considered a change in capacitance brought about by the insertion of a plasma into a cavity, the change in C being proportional to the electron density. To achieve parametric amplification, Bridges' criterion of a varying C must be met. From (3) it can be seen that if $\rho$ is varied, the change in capacitance will be varied, and parametric amplification will be possible.

If an isotropic plasma is subjected to a radio frequency field, there will be no variation in electron density since, in any given plane through the plasma, the charge carriers, that is, electrons, describe identical motions. By the same token, if the plasma is subjected to parallel electric and magnetic fields the magnetic field will not act upon the electrons, since the motion of the electrons, due to the electric field, is in the direction of the magnetic field; hence, effectively, the magnetic field is zero and there will again be no charge density modulation. This can be verified mathematically using Maxwell's equations, where $$\rho_1=\epsilon\nabla\cdot\vec{E} \qquad (4)$$

where $\rho_1$ is the change in charge density, $\epsilon$ is the dielectric constant of the medium and $\vec{E}$ is the electric field, a vector (spatial) quantity in this case. In the case of no magnetic field, it can be shown by Maxwell's equations that $\nabla\cdot\vec{E}$ is zero, hence there can be no charge density modulation, that is, $\rho_1$ is zero. It is necessary, therefore, that a magnetic field be utilized which results in a value other than zero for $\nabla\cdot\vec{E}$.

If the magnetic field $H_0$ is oriented such that it is normal to the electric field of the modulating wave and the direction of propagation of the wave producing that field, for example, $H_0$ is parallel to the Y-axis, the electric field is parallel to the X-axis and is designated $E_x$, and the direction of propagation is along the Z-axis, then from Maxwell's equations it can be shown that $\nabla\cdot\vec{E}$ is to equal zero and there will be produced an electric field $E_z$ in the direction of propagation of the wave. This induced field can be explained, at least in part, by the fact that electrons under the influence of an electric field and a magnetic field at right angles develop a cyclotron motion which produces a potential gradient at right angles to both the stimulating electric field and the magnetic field. Under these conditions, it can be said that the plasma is no longer isotropic, and is now anisotropic, and $$\nabla\cdot\vec{E}=\frac{\partial E_z}{\partial z} \qquad (5)$$

but $$\rho_1=\epsilon\nabla\cdot\vec{E} \qquad (6)$$

therefore $$\rho_1=\epsilon\frac{\partial E_z}{\partial z}\propto\frac{\partial E_z}{\partial z} \qquad (7)$$

Inasmuch as $E_z$ resulted directly from the presence of $E_x$, if E is made to vary with time, $E_z$ will likewise vary with time and, consequently, $\rho_1$ will vary with time. A time varying charge density, or, in other words, a charge density modulation, produces, as can be seen from (3), a time varying $\Delta C$. The foregoing is based upon the presence of the plasma in a region of pump gradient, that is, where $E_x$ varies with $z$. For the device shown in FIG. 1, this region has been considered as being at the center of the resonator; it is possible, however, that the region of gradient may be elsewhere than the center of the resonator.

From the foregoing analysis, it can be seen that the device of FIG. 1 meets the criteria set forth in the aforementioned Bridges' letter, and parametric amplification of the signal $f_s$ results. By operating the device at low temperatures, the indium-antimony sample produces good low noise gain. Other materials than indium-antimony may be used to produce gain, but in most cases these materials require lower operating temperatures than the indium-antimony. It is possible, too, to produce low noise gain with the device of FIG. 1 when the pumping frequency is not twice the signal frequency, if the resonator 12 is made resonant at the pump frequency, the signal frequency, and the pump frequency minus the signal frequency. It is possible, in this latter case, to utilize both the amplified signal and the difference frequency as outputs. In addition, when the pump frequency is not twice the signal frequency, the phase shifter 17 is no longer necessary.

In FIG. 2 there is shown a device 31 embodying the principles of the present invention designed for use as a frequency multiplier. For simplicity, those elements of device 31 which are the same as corresponding elements of the device 11 of FIG. 1 have been given the same reference numerals.

Device 31 comprises a cavity resonator 12 having centrally mounted therein, in the X—Y plane, a slab 26 of semiconductor material, shown supported by a member 27 of polyfoam or other suitable material, similar to the arrangement in FIG. 1. A permanent magnet 24 establishes within resonator 12 a magnetic field $H_0$ parallel to the Y-axis. Resonator 12 is resonant at a frequency $f_s$ and at a frequency $2f_s$. As was pointed out in the discussion of FIG. 1, and equally applicable in the device 31 of FIG. 2, it is possible to utilize a resonator resonant at three frequencies having the relationship discussed in the foregoing.

Connected to resonator 12 and communicating with the interior thereof through a suitable iris 32 is a waveguide 33 for propagating waves at a frequency $f_s$ in the direction of the X-axis and so oriented that the electric field of the waves is parallel to the Y-axis. A source 34 of electromagnetic waves at the frequency $f_s$ is connected to waveguide 33. An output waveguide 36 is connected to resonator 12 and communicates with the interior thereof through a suitable iris 37. A load or utilization device 38 is connected to output waveguide 36.

In operation, energy at the frequency $f_s$ from the source 34 is supplied to resonator 12 through waveguide 33 and iris 32. Output energy at a frequency $2f_s$ is extracted from resonator 12 through iris 37 and guide 36 and is applied to a suitable utilization device 38. The ability of the device 31 of FIG. 2 to produce frequency multiplication is a result of an inherent characteristic of parametric amplifiers, which is that they are reversible. It can readily be shown that in the device 31 of FIG. 2, when energy at a frequency $f_s$ is applied to resonator 12, energy at a frequency $2f_s$ can be extracted from the resonator.

In the foregoing, the principles of the invention have been illustrated in only a few of the possible embodiments. Various other embodiments and modifications may occur to workers in the art without departing from the spirit and scope of the present invention.

What is claimed is:

1. In combination, a cavity resonator resonant at first and second frequencies, means for producing a variable capacitance parameter in said resonator comprising an element of single conductivity type semiconductor material within said resonator, said element having first, second, and third coordinate axes, means applying a steady state magnetic field to said element parallel to one of said axes, means applying radio frequency waves at said first frequency to said resonator with the electric field of the waves parallel to another of said axes, and means for applying energy at said second frequency to said resonator and extracting energy at said second frequency from said resonator, the frequencies being so related as to produce parametric amplification.

2. In combination, means for sustaining electromagnetic waves of first and second frequencies, said means being characterized by a capacitance parameter, an element of single conductivity type semiconductor material within said means, means for applying a magnetic field to said element, means for varying the capacitance parameter of said sustaining means, said last-mentioned means comprising means for applying electromagnetic waves at said first frequency to said sustaining means with the electric field of said waves at right angles to said magnetic field, and means for applying electromagnetic waves at said second frequency to said sustaining means, the frequencies being so related as to produce parametric amplification.

3. The combination as claimed in claim 2 wherein said sustaining means is a cavity resonator.

4. A frequency multiplier comprising a cavity resonator resonant at frequencies $f_s$ and $2f_s$, means for producing a variable capacitance parameter in said resonator comprising an element of single conductivity type semiconductor material within said resonator, said element having first, second, and third coordinate axes, means for applying a steady state magnetic field to said element parallel to one of said axes, means for applying energy at a frequency $f_s$ to said resonator, and means for extracting energy at the frequency $2f_s$ from said resonator, with the electric field of the energy thus extracted being parallel to another of said coordinate axes.

5. An amplifier comprising a cavity resonator resonant at at least two frequencies, means for producing a variable capacitance parameter in said resonator comprising an element of single conductivity type semiconductor material in said resonator, means for applying a steady state magnetic field to said element, means for applying electromagnetic wave energy at one of said frequencies to said resonator with the electric field of said wave energy, said magnetic field, and the direction of propagation of the wave energy being mutually perpendicular, and means for applying signals to be amplified and extracting amplified signals from said resonator, the frequencies of said signals and said wave energy being so related as to produce parametric amplification.

References Cited in the file of this patent

UNITED STATES PATENTS

| | | |
|---|---|---|
| 2,649,574 | Mason | Aug. 18, 1953 |
| 2,777,906 | Shockley | Jan. 15, 1957 |
| 2,784,378 | Yager | Mar. 5, 1957 |
| 2,922,876 | Ayres et al. | Jan. 26, 1960 |
| 2,944,169 | Matare | July 5, 1960 |
| 2,958,045 | Anderson | Oct. 25, 1960 |
| 3,002,156 | Boyle et al. | Sept. 25, 1961 |
| 3,012,183 | Robinson | Dec. 5, 1961 |

FOREIGN PATENTS

| | | |
|---|---|---|
| 1,168,080 | France | Aug. 25, 1958 |
| 222,757 | Austria | July 16, 1959 |

OTHER REFERENCES

Kromer: "Proceedings of the IRE," March 1959, pages 397–406.

Reed: "IRE Transactions on Electron Devices," April 1959, pages 216–224.